(12) United States Patent
Myung et al.

(10) Patent No.: US 9,507,440 B2
(45) Date of Patent: *Nov. 29, 2016

(54) APPARATUS AND METHOD TO DETECT COORDINATES IN A PEN-BASED DISPLAY DEVICE

(71) Applicant: Samsung Electronics Co. Ltd., Suwon-si, Gyeonggi-do (KR)

(72) Inventors: Seho Myung, Seoul (KR); Sung-Hee Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 487 days.

This patent is subject to a terminal disclaimer.

(21) Appl. No.: 13/856,692

(22) Filed: Apr. 4, 2013

(65) Prior Publication Data
US 2013/0265255 A1 Oct. 10, 2013

(30) Foreign Application Priority Data

Apr. 4, 2012 (KR) .................. 10-2012-0034770

(51) Int. Cl.
*G06F 3/0354* (2013.01)
*G06F 3/03* (2006.01)

(52) U.S. Cl.
CPC ........... *G06F 3/0354* (2013.01); *G06F 3/0321* (2013.01)

(58) Field of Classification Search
CPC ............ G06F 3/0321; G06F 3/03545; G06K 19/06037
See application file for complete search history.

(56) References Cited

U.S. PATENT DOCUMENTS

| | | | |
|---|---|---|---|
| 2002/0046887 A1* | 4/2002 | Yanagisawa et al. | 178/18.01 |
| 2002/0084335 A1 | 7/2002 | Ericson | |
| 2006/0193522 A1* | 8/2006 | Sonoda et al. | 382/232 |

* cited by examiner

*Primary Examiner* — Dorothy Harris
(74) *Attorney, Agent, or Firm* — Jefferson IP Law, LLP

(57) ABSTRACT

An apparatus to detect coordinates in a pen-based display device is provided. When an electronic pen is placed at a specific position on a display, an image of a pixel group corresponding to a specific position is captured through a camera, a reference point is detected in the pixel group by processing the captured image of the pixel group, values of a plurality of coordinate indications and a plurality of parity indications, it is determined whether an error has been detected by calculating a predetermined error detection formula using the determined values of the coordinate indications and the parity indications, and final coordinates of the electronic pen are determined by applying a predetermined coordinates calculation rule to the determined values of the coordinate indications and the parity indications, if no error has been detected in the determined values of the coordinate indications and the parity indications.

37 Claims, 9 Drawing Sheets

■ REFERENCE POINT (202)
▣ X-COORDINATE INDICATION (203)
▥ Y-COORDINATE INDICATION (204)
▨ PARITY INDICATION (205)

APPARATUS AND METHOD TO DETECT COORDINATES IN A PEN-BASED DISPLAY DEVICE

PRIORITY

This application claims the benefit under 35 U.S.C. §119 (a) of a Korean patent application filed on Apr. 4, 2012 in the Korean intellectual Property Office and assigned. Serial No. 10-2012-0034770, the entire disclosure of which is hereby incorporated by reference.

BACKGROUND OF THE INVENTION

1. Field of the Invention

The present invention relates to an electronic device having a display device. More particularly, the present invention relates to a method and apparatus to detect coordinates in an electronic device having a pen-based display device.

2. Description of the Related Art

Typically, electronic devices such as a TeleVision (TV), a portable phone, a computer, an electronic blackboard, a tablet, an e-book reader, and a smart phone adopt a keyboard, a keypad, a mouse, and so forth for interfacing with a user. However, with the recent development trend of small-size electronic devices with enhanced portability, User Interface (UI) methods have evolved accordingly. Major UI methods include a touch screen input scheme in which a user applies an input by directly touching a screen with a finger or a touch pen and a motion recognition scheme in which a user applies an input by a gesture.

The touch screen input scheme requires inputs such as a handwritten input on a display. For example, a resistive-type touch screen input scheme enables input through an input means like a stylus pen. However, as a capacitive-type touch screen input scheme has gained in popularity, handwriting is difficult to input.

In the touch screen input schemes, an input is determined by recognizing patterns predefined on a display using an electronic pen. Specifically, patterns formed on the display are recognized by means of the electronic pen having a camera, the position of the electronic pen is detected based on the recognized patterns, and an input is determined based on the detected position value. That is, an area of the display pointed by the electronic pen is captured along the direction of the pen point of the electronic pen through the camera and preset patterns are detected from the captured image. Thus, the position pointed by the electronic pen or a command is recognized based on the detected patterns.

FIG. 1 illustrates exemplary patterns formed on a display in an electronic pen-based input scheme according to the related art.

Referring to FIG. 1, pixels 101, sub-pixels 103, and Black Matrices (BMs) 105 are defined on a display. Each pixel 101 is divided into sub-pixels 103 representing Red (R), Green (G) and Blue (B), respectively. Adjacent sub-pixels and adjacent pixels are separated from each other by BMs 105.

According to the electronic pen-based input scheme illustrated in FIG. 1, changed sub-pixels 107 are obtained by applying preset patterns to pixels or sub-pixels. A position or motion on the display may be determined by recognizing changed sub-pixels 107 using an electronic pen. However, the changed sub-pixels 107 cause performance degradation of the display. That is, the changed sub-pixels 107 may distort represented colors or affect brightness or sharpness of the display in relation to the performance of the display.

Moreover, when the electronic pen recognizes a wrong pattern, it is not easy to detect or correct the error.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide an apparatus and method to recognize a position and a pattern using an electronic pen in an electronic device having a touch input-type display device.

Another aspect of the present invention is to provide an apparatus and method to recognize a position and a pattern using an electronic pen without almost any degradation of brightness or contrast of a display in an electronic device having a touch input-type display device.

Yet another aspect of the present invention is to provide an apparatus and method to detect or correct a pattern recognition error in an electronic device having a touch input-type display device.

In accordance with an aspect of the present invention, a method of detecting coordinates of a position of an electronic pen on a display based on a plurality of pixel groups arranged on the display is provided. In the method, when the electronic pen is placed at a specific position on the display, an image of a pixel group corresponding to the specific position is captured through a camera provided in the electronic pen, a reference point is detected in the pixel group by processing the captured image of the pixel group, values of a plurality of coordinate indications and a plurality of parity indications corresponding to the position of the pixel group are determined, it is determined whether an error has been detected by calculating a predetermined error detection formula using the determined values of the coordinate indications and the parity indications, and final coordinates of the electronic pen are determined by applying a predetermined coordinates calculation rule to the determined values of the coordinate indications and the parity indications, if no error has been detected in the determined values of the coordinate indications and the parity indications.

In accordance with another aspect of the present invention, a method of detecting coordinates of a position of an electronic pen on a display based on a plurality of pixel groups arranged on the display is provided. In the method, when the electronic pen is placed at a specific position on the display, an image of a pixel group corresponding to the specific position captured through a camera provided in the electronic pen is received from the electronic pen, detecting a reference point is detected in the pixel group by processing the captured image of the pixel group, values of a plurality of coordinate indications and a plurality of parity indications corresponding to the position of the pixel group are determined, it is determined whether an error has been detected by calculating a predetermined error detection formula using the determined values of the coordinate indications and the parity indications, and final coordinates of the electronic pen are determined by applying a predetermined coordinates calculation rule to the determined values of the coordinate indications and the parity indications, if no error has been detected in the determined values of the coordinate indications and the parity indications.

In accordance with another aspect of the present invention, an apparatus to detect coordinates of a position on a display based on a plurality of pixel groups arranged on the display is provided. In the apparatus, when an electronic pen is placed at a specific position on the display, a camera unit captures an image of a pixel group corresponding to the specific position, a recognizer detects a reference point in the pixel group by processing the captured image of the pixel group and determines values of a plurality of coordinate indications and a plurality of parity indications corresponding to the position of the pixel group, an error detection and correction unit determines whether an error has been detected by calculating a predetermined error detection formula using the determined values of the coordinate indications and the parity indications, and outputs the determined values of the coordinate indications and the parity indications, if no error has been detected in the determined values of the coordinate indications and the parity indications, and a coordinates decider determines final coordinates of the electronic pen by applying a predetermined coordinates calculation rule to the values of the output coordinate indications and the parity indications.

In accordance with another aspect of the present invention, an apparatus to detect coordinates of a position on a display based on a plurality of pixel groups arranged on the display is provided, in the apparatus, when an electronic pen is placed at a specific position on the display, a recognizer detects a reference point in an image of a pixel group corresponding to the specific position by processing the image of the pixel group, the image of pixel group being captured by a camera provided in the electronic pen, and determines values of a plurality of coordinate indications and a plurality of parity indications corresponding to the position of the pixel group, an error detection and correction unit determines whether an error has been detected by calculating a predetermined error detection formula using the determined values of the coordinate indications and the parity indications, and outputs the determined values of the coordinate indications and the parity indications, if no error has been detected in the determined values of the coordinate indications and the parity indications, and a coordinates decider determines final coordinates of the electronic pen by applying a predetermined coordinates calculation rule to the output values of the coordinate indications and the parity indications.

In accordance with another aspect of the present invention, a display panel to display content received from an electronic pen is provided. On the panel, pixel groups are arranged, each pixel group being a minimum unit recognized by the electronic pen, a pattern representing a reference point is formed on a first sub-pixel among sub-pixels of pixels included in each pixel group, and one of a plurality of patterns representing a plurality of coordinate indications and a plurality of parity indications corresponding to a position of the electronic pen is formed on each of the other sub-pixels except for the first sub-pixel among the sub-pixels of the pixels included in each pixel group.

In accordance with a further aspect of the present invention, there is provided a method of fabricating a display panel to display content received from an electronic pen, in which pixel groups are arranged, each pixel group being a minimum unit recognized by the electronic pen, a pattern representing a reference point is formed on a first sub-pixel among sub-pixels of pixels included in each pixel group, and one of a plurality of patterns representing a plurality of coordinate indications and a plurality of parity indications corresponding to a position of the electronic pen is formed on each of the other sub-pixels except for the first sub-pixel among the sub-pixels of the pixels included in each pixel group.

Other aspects, advantages, and salient features of the invention will become apparent to those skilled in the art from the following detailed description, which, taken in conjunction with the annexed drawings, discloses exemplary embodiments of invention.

BRIEF DESCRIPTION OF THE DRAWINGS

The above and other objects, features, and advantages of certain exemplary embodiments of the present invention will be more apparent from the following description taken in conjunction with the accompanying drawings, in which.

Throughout the drawings, like reference numerals will be understood to refer to like parts, components, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The present invention provides an input method for an electronic pen which may be used for an electronic device having a display screen, such as a portable phone, a computer, an electronic blackboard, a tablet, or an e-book reader. Particularly, the present invention provides an electronic pen-based input method in which specific patterns formed on sub-pixels are recognized using an electronic pen. The position of the electronic pen is determined based on the recognized patterns and an input is applied at the determined position on a display such as a Liquid Crystal Display (LCD) display, a Plasma Display Panel (PDP) display, an Organic Light Emitting Diode (OLED) display, an Active Matrix OLED (AMOLED) display, or an electronic paper display.

Accordingly, the present invention provides an electronic pen which detects patterns formed in parts of sub-pixels and determines an input position and gesture information, and a display including sub-pixels formed into predetermined patterns.

The present invention is applicable irrespective of the type of a display used. The display may be configured as an LCD display, a PDP display, an OLED, an AMOLED display, or an electronic paper display.

Figure 1:
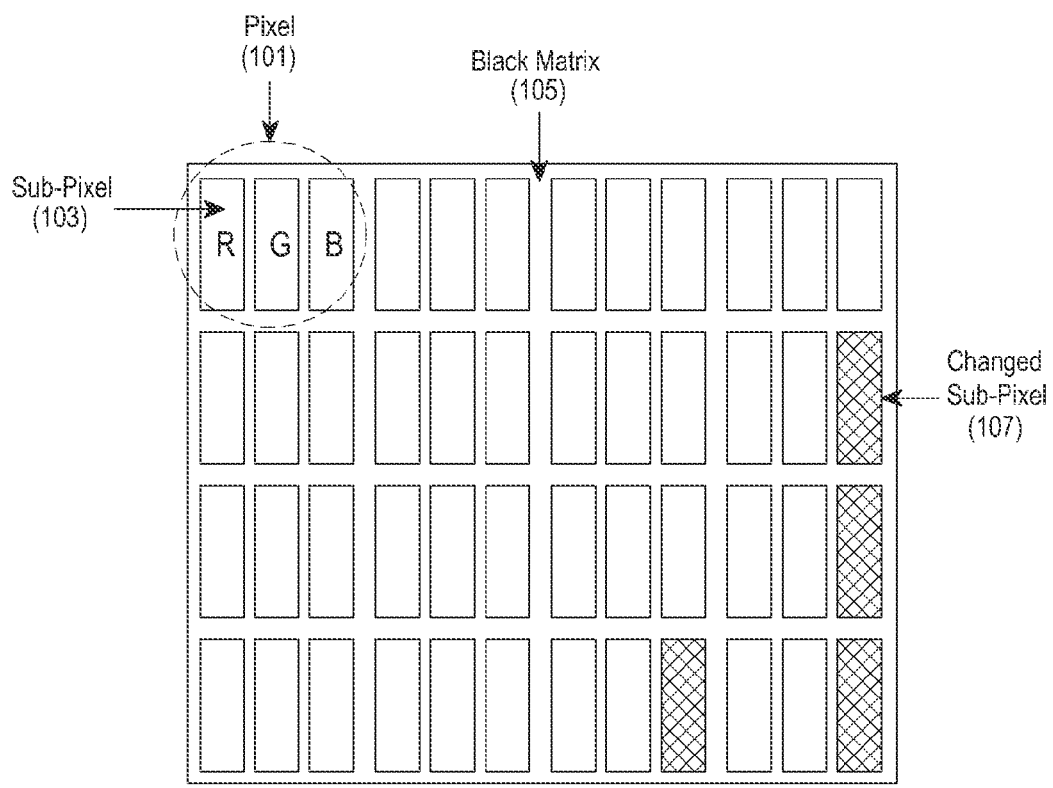
FIG. 1 illustrates exemplary patterns formed on a display in an electronic pen-based input scheme according to the related art.
Figure 2A:
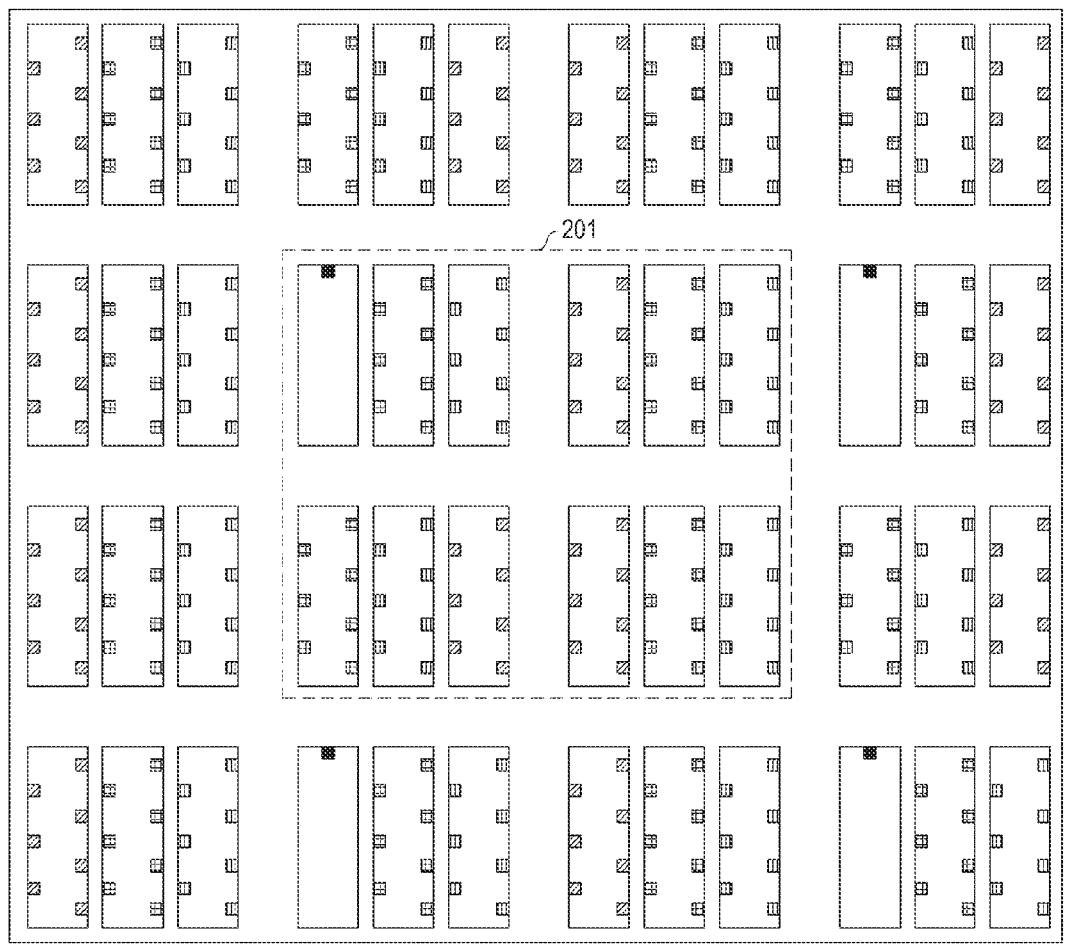
FIGS. 2A and 2B illustrate exemplary methods of forming patterns on as display to implement an electronic pen-based input scheme according to an exemplary embodiment of the present invention.
Figure 2B:
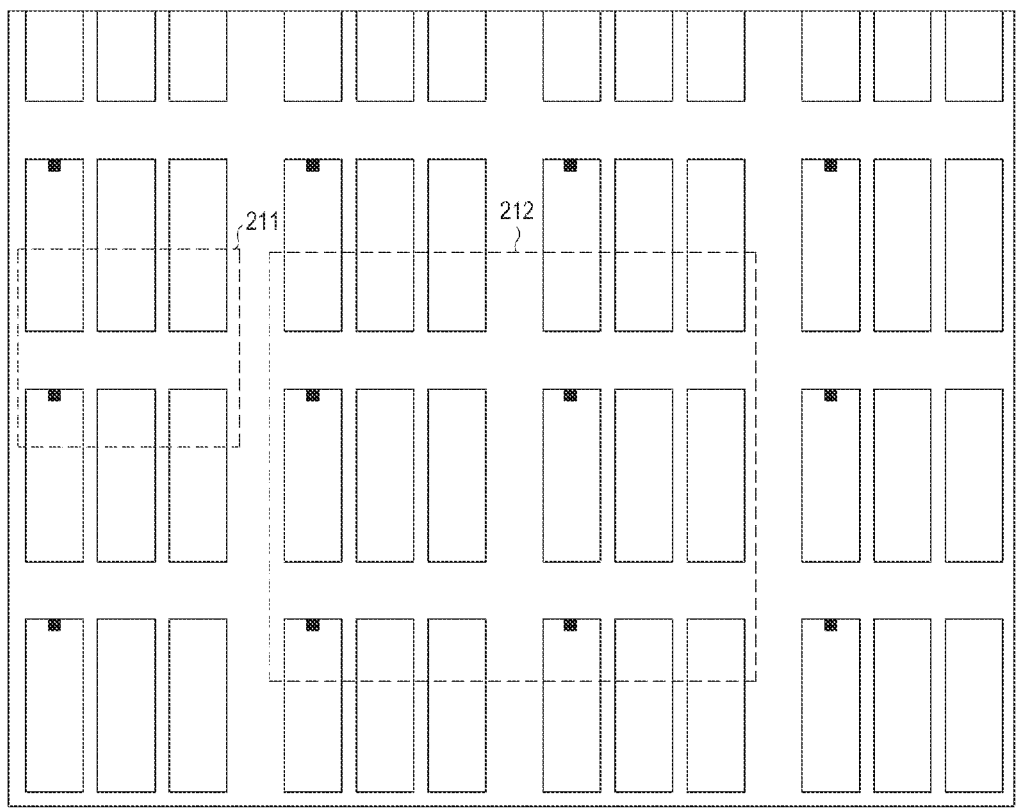

FIGS. 2A and 2B illustrate exemplary methods of forming patterns on a display to implement an electronic pen-based input scheme according to an exemplary embodiment of the present invention.

In particular, FIG. 2A illustrates an example in which patterns are formed on pixels in a display.

Referring to FIG. 2A, four pixels are set as a minimum unit to be optically recognized by an electronic pen, as indicated by reference numeral 201. Predetermined patterns are regularly formed on each pixel. For example, since the same pattern representing a reference point 202 is formed at a fixed position in every four pixels 201, the electronic pen may detect the reference point 202 to determine a reference at which to start a coordinate recognition operation. While the minimum unit to be optically recognized by the electronic pen is set to 4 pixels, the minimum unit is not limited to any specific value.

After detecting the reference point 202, the electronic pen recognizes X-coordinate indications 203 and Y-coordinate indications 204 to determine its position. Each X-coordinate indication 203 is positioned at one of 7 positions defined in a sub-pixel and each Y-coordinate indication 204 is positioned at one of 7 positions defined in a sub-pixel.

FIG. 2B illustrates another exemplary embodiment of a minimum unit that an electronic pen optically recognizes according to an exemplary embodiment of the present invention.

Referring to FIG. 2B, reference numeral 211 denotes one pixel. If the minimum unit to be optically recognized by the electronic pen is set to four pixels, reference numeral 212 denotes the minimum unit. In this manner, pixels and sub-pixels may be configured differently depending on the characteristics of a display and the recognition minimum unit of the electronic pen and the coordinate indications may be configured according to the pixel configuration of the display.

Figure 3A:
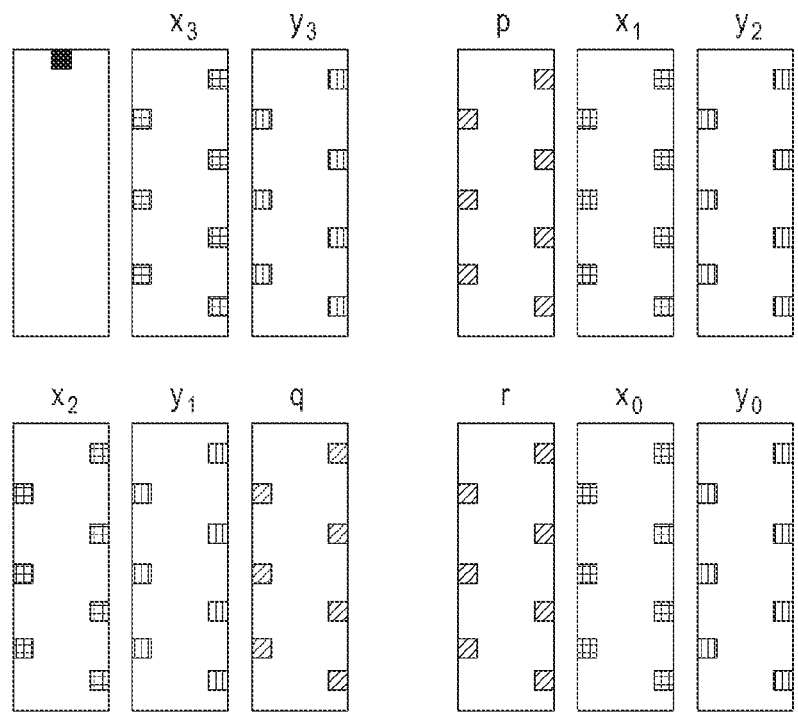
FIGS. 3A and 3B illustrate mapping relationships between sub-pixels and coordinate indications on a display according to an exemplary embodiment of the present invention.
Figure 3B:
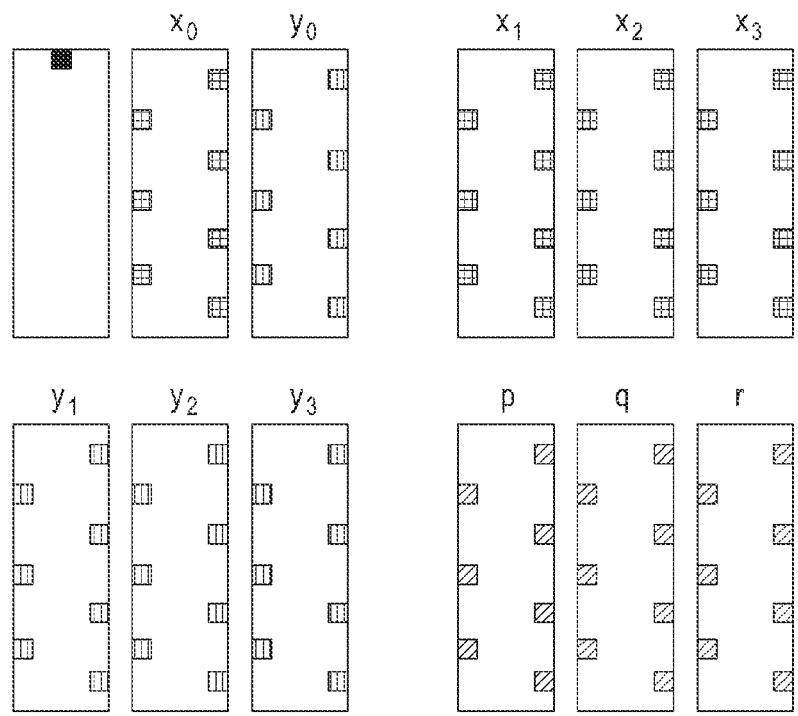

FIGS. 3A and 3B illustrate mapping relationships between sub-pixels and coordinate indications on a display according to an exemplary embodiment of the present invention. In particular, FIGS. 3A and 3B illustrate exemplary mapping relationships between indications and sub-pixels, if X-coordinate indications 203 and Y-coordinate indications 204 illustrated in FIGS. 2A and 2B are denoted respectively $x_3$, $x_2$, $x_1$, $x_0$, $y_3$, $y_2$, $y_1$ and $y_0$.

It is readily understood that there may exist many indication-sub-pixel mapping relationships other than those illustrated in FIGS. 3A and 3B.

A position of the display pointed at by the electronic pen is determined by recognizing the values of X-coordinate indications 203 and Y-coordinate indications 204 corresponding to sub-pixels and applying a predetermined rule to the recognized values. For example, if each of the coordinate indications x3, x2, $x_3$, $x_2$, $x_1$, $x_0$, $y_3$, $y_2$ and $y_1$ has an integer value ranging from 0 to 6 and the coordinate indication $y_0$ has an integer value ranging from 0 to 3, an X coordinate may be calculated by mathematical Equation (1) and a Y coordinate may be calculated by mathematical Equation (2).

$$7^3 x x_3 + 7^2 x x_2 + 7) x_1 + x_0 \qquad \text{Equation (1)}$$

$$7^3 \times 4 \times y_3 + 7) a t y_2 + 4) y_1 + y_0 \qquad \text{Equation (2)}$$

According to mathematical Equation (1), the X coordinate may indicate one of a total of 2401 positions, ranging from 0 to 2400 and the Y coordinate may indicate one of a total of 1600 positions, ranging from 0 to 1599, according to the values of the coordinate indications $x_3$, $x_2$, $x_1$, $x_0$, $y_3$, $y_2$, $y_1$ and $y_0$. If the optical recognition minimum unit of the electronic pen is 2×2 pixels as described above, a position on a display having 4802(=2401×2) pixels along an X-axis direction and 3200(=1600×2) pixels along a Y-axis direction may be represented using the method illustrated in FIGS. 2A, 2B, 3A, and 3B and mathematical Equations (1) and (2).

If the optical recognition minimum unit of the electronic pen is A×B pixels, the method illustrated in FIGS. 2A, 2B, 3A, and 3B, and mathematical Equations (1) and (2) are available to any display having 2401×A pixels along the X-axis direction and 1600×B pixels along the Y-axis direction, for position representation.

While 7 positions are defined in each sub-pixel to represent an X-coordinate indication 203 and a Y-coordinate indication 204 in FIG. 2A, the number of positions defined in a sub-pixel is not limited to any specific value. However, if more positions are available to an X-coordinate indication 203 and a Y-coordinate indication 204 in sub pixels, the recognition performance of the electronic pen may be increased, but an apparatus to recognize a position and a pattern gets expensive.

A position on a display may be calculated in a different manner by modifying the mathematical equations for calculating the X and Y coordinates based on the values of X-coordinate indications 203 and Y-coordinate indications 204.

Figure 4A:
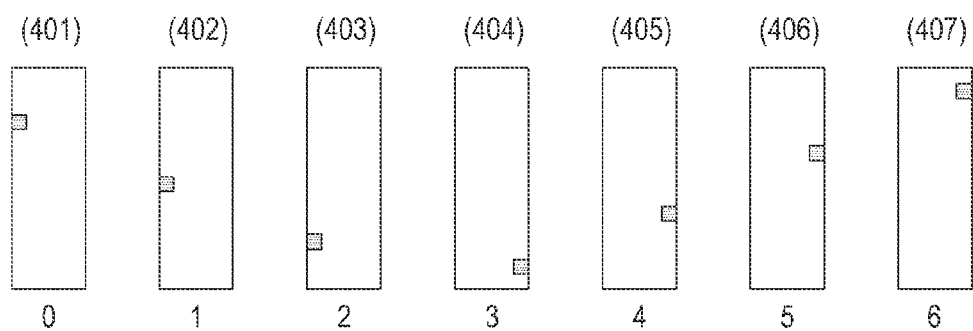
FIGS. 4A and 4B illustrate mapping relationships between patterns and coordinate indications on a display according to an exemplary embodiment of the present invention.

A method of defining coordinate values using the patterns of X-coordinate indications 203 and Y-coordinate indications 204 illustrated in FIGS. 2A and 2B is provided with reference to FIG. 4A. For the sake of brevity, it is assumed that each of the coordinate indications x3, x2, x1, x0, y3, y2 and y1 has an integer value ranging from 0 to 6 and the coordinate indication y0 has an integer value ranging from 0 to 3.

Figure 4B:
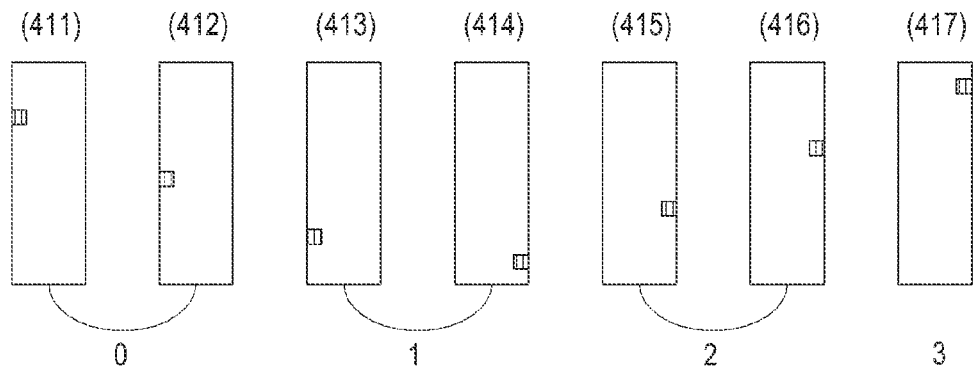

FIGS. 4A and 4B illustrate mapping relationships between patterns and coordinate indications on a display according to an exemplary embodiment of the present invention.

FIG. 4A illustrates an example of defining values for each of the coordinate indications $x_3$, $x_2$, $x_1$, $x_0$, $y_3$, $y_2$ and $y_1$ according to an exemplary embodiment of the present invention.

Referring to FIG. 4A, each indication pattern corresponds to one of numbers 0 to 6. For example, if a pattern 403 is formed on a sub-pixel, the pattern corresponds to number 2. Accordingly, one of the coordinate indications $x_3$, $x_2$, $x_1$, $x_0$, $y_3$, $y_2$ and $y_1$ corresponding to the sub-pixel has a value of 2.

FIG. 4B illustrates an example of defining values for the coordinate indication $y_0$. Since the coordinate indication $y_0$ ranges from 0 to 3 and a total of 7 patterns are available to represent the coordinate indication $y_0$, patterns having the same value will exist. For example, although reference numerals 413 and 414 denote different patterns, the patterns 413 and 414 may be defined as the same value of 1. The method of determining X and Y coordinates illustrated in FIGS. 4A and 4B is exemplary and thus many other methods are applicable.

Figure 5:
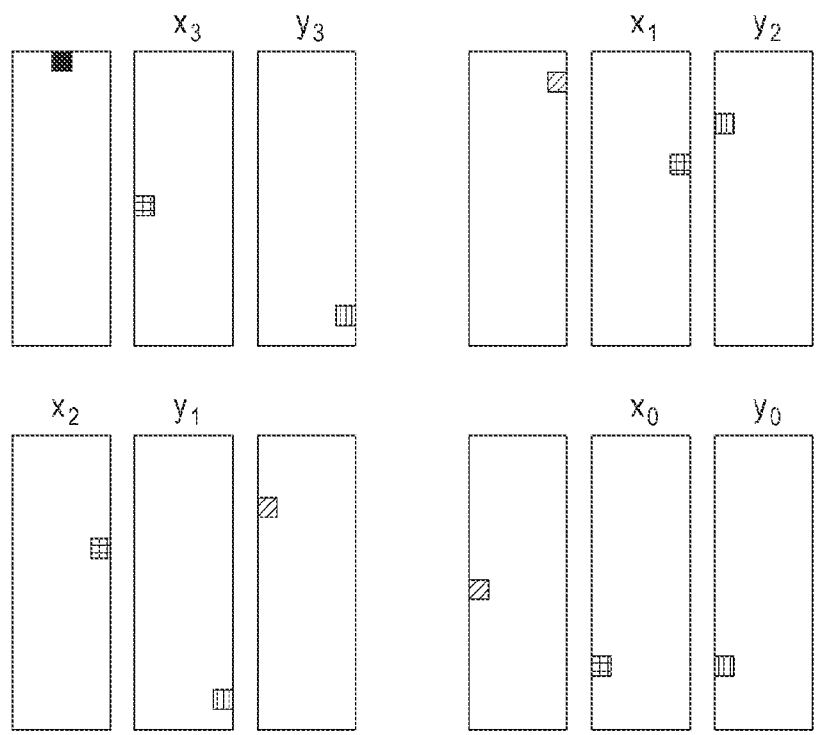
FIG. 5 illustrates exemplary patterns formed on a display according to an exemplary embodiment of the present invention.

FIG. 5 illustrates exemplary patterns formed on a display according to an exemplary embodiment of the present invention.

If the values of X-coordinate indications and Y-coordinate indications illustrated in FIG. 5 are calculated according to the patterns illustrated in FIGS. 4A and 4B, with coordinate indications having values of $x_3=1$, $x_2=5$, $x_1=5$, $x_0=2$, $y_3=3$, $y_2=0$, $y_1=3$, and $y_0=1$. Mathematical Equations (1) and (2) are calculated using these values. Then X and Y coordinates are obtained as follows.

$$7^3 \times 1 + 7^2 \times + )and (2) \qquad \text{Equation (3)}$$

$$7^2 \times 4 \times 3 + 7 \times + 70 + 4 \times + 41 = 601 \qquad \text{Equation (4)}$$

Figure 6:
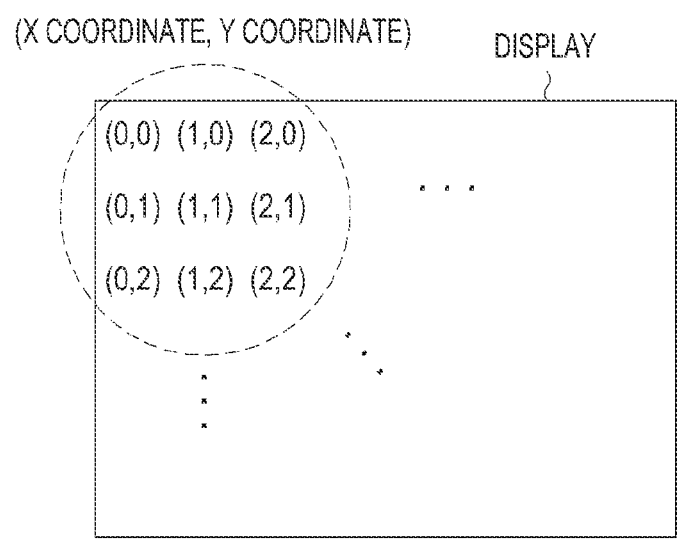
FIG. 6 illustrates a relationship between coordinates and a display according to an exemplary embodiment of the present invention.

In general, X and Y coordinates are sequentially defined on a display with respect to an upper left corner as the origin, as illustrated in FIG. 6. It is also possible to define the X and Y coordinates in a different manner to ensure security or for other purposes. A method to set X and Y coordinates is not required to implement the present invention and a detailed description of the same is not provided herein. For the sake of brevity, the present invention will be described using the sequential coordinates setting as illustrated in FIG. 6.

FIG. 6 illustrates a relationship between coordinates and a display according to an exemplary embodiment of the present invention.

Unless specifically mentioned otherwise, each X-Y coordinate pair illustrated in FIG. 6 represents the position of our pixels because the minimum unit used to recognize patterns by the electronic pen is assumed to be 4 pixels.

The operation of recognizing a position by the electronic pen described above with reference to FIGS. 2A to 5 is summarized as follows.

Position Recognition Operation of the Electronic Pen
  (1) Pixels of a display are captured;
  (2) A reference point is detected;
  (3) X-coordinate indications and Y-coordinate indications are recognized with respect to the reference point and the values of the X-coordinate indications and the Y-coordinate indications are determined; and (4) Final X-Y coordinates are calculated by applying a predetermined rule to the values of the X-coordinate indications and the Y-coordinate indications.

If the electronic pen determines wrong values of the X-coordinate indications and the Y-coordinate indications during recognition of the reference point in the above position recognition operation, a great error may occur to the finally determined position. For example, in the exemplary embodiment using FIG. 2A to FIG. 4B and mathematical Equations (1) and (2), if the value of $x_3$ or $y_3$ is recognized with an error of 1, a position error of $7^3(=343)$ results according to mathematical Equation (1). When the electronic pen fails to detect the position error, the electronic pen may represent the wrong position on the display.

To minimize this problem, parity indications 205 illustrated in FIG. 2A provide redundancy information for error detection or error correction, in the case where the electronic pen determines wrong values for X-coordinate indications 203 and Y-coordinate indications 204. The present invention provides optimized error detection and error correction methods according to the exemplary embodiment illustrated in FIGS. 2A, 2B, 3A, and 3B.

Referring to FIGS. 2A, 2B, 3A, and 3B, the recognition minimum unit of the electronic pen includes eight coordinate indications, $x_3$, $x_2$, $x_1$, $x_0$, $y_3$, $y_2$, $y_1$ and $y_0$ and three parity indications p, q and r. For error detection, it may be assumed that the parity indications are calculated using the coordinate indications by mathematical Equation (5) below.

$$p = (x_3 + y_1 + x_0) \bmod 7$$

$$q = (x_2 + y_2) \bmod 7$$

$$r = (x_1 + y_3 + y_0) \bmod 7 \qquad \text{Equation (5)}$$

As noted from mathematical Equation (5), even though one of the coordinate indications is erroneous, the error is easily detected. For example, if $x_3$ has an error, the first equation in mathematical Equation (5) is not satisfied and thus the error is easily detected. Likewise, if any of the other coordinate indications has an error, one of the equations in mathematical Equation (5) is not satisfied and thus the error is easily detected.

However, a drawback with the method expressed as mathematical Equation (5) is that if two or more errors occur, the errors are not detected. For example, if both $x_2$ and $x_3$ have errors, the first and second equations in mathematical Equation (5) are not satisfied and thus the errors are detected. On the other hand, if an error of an integer A occurs to $x_3$ and an error of −A occurs to $x_0$ during recognition of the coordinate indications, all equations of mathematical Equation (5) are satisfied. The same thing occurs when an error of an integer B and an error of −B occur to $x_2$ and $y_0$, respectively and thus all equations of Equation (5) are satisfied. Likewise, if an error of an error C occurs to both $x_3$ and p, all equations of mathematical Equation (5) are satisfied. That is, when two errors are generated during recognition of coordinate indications and parity indications, mathematical Equation (5) may fail in detecting the errors.

In this context, the present invention provides a parity generation rule having a minimum computation complexity, which enables detection of any error pattern when one or two errors are generated during recognition of the values of coordinate indications and parity indications.

First of all, each coordinate indication should be involved in generation of two or more parities in order to detect two errors in the recognized values of coordinate indications and parity indications. However, as each coordinate indication is involved in generation of more parities, computation complexity increases. Accordingly, when each coordinate indication is involved in generation of only two parities, the computation complexity is minimized.

In summary, to enable error detection and achieve a minimum computation complexity in the case of one or two errors during recognition of the values of coordinate indications and parity indications, the parity generation rule should satisfy the following conditions.

<Parity Generation Rule 1>

(1) Each coordinate indication is involved in calculation of two parities during generation of parities; and (2) When one or two errors are generated, one or more parities calculated by a parity generator formula using the values of the coordinate indications having the errors are different from the existing parities.

To describe an exemplary embodiment satisfying Parity generation rule 1, it is assumed that parities are generated by mathematical Equation (6) in the exemplary embodiment of recognizing the position of the electronic pen according to FIGS. 2A, 2B, 3A, and 3B, and mathematical Equations (1) and (2).

$$p=(x_0+x_1+x_2+y_0+y_1+y_2) \bmod 7$$

$$q=(x_0+2x_1+4x_2+x_3+y_2) \bmod 7$$

$$r=(y_0+2y_1+4y_2+x_3+2y_3) \bmod 7 \quad \text{Equation (6)}$$

Referring to mathematical Equation (6), each of the coordinate indications $x_3$, $x_2$, $x_1$, $x_0$, $y_3$, $y_2$, $y_1$ and $y_0$ is involved in generation of two of the parity indications p, q and r, thus minimizing the computation complexity. Besides, when Equation (6) is calculated regarding one or two errors, one or more parity generation equations are not satisfied in Equation (6).

The above parity generation method enables detection of two or fewer errors, minimizing the computation complexity.

The parity generation Equation (6) may correct one error as well as detect one or two errors. Mathematical Equation (6) may be modified to mathematical Equation (7).

$$E1=(x_0+x_1+x_2+y_0+y_1+y_2-p) \bmod 7$$

$$E2=(x_0+2x_1+4x_2+x_3+y_2-q) \bmod 7$$

$$E3=(y_0+2y_1+4y_2+x_3+2y_3-r) \bmod 7 \quad \text{Equation (7)}$$

For the convenience' sake, the actual coordinate indications and parity indications are denoted by $x_3$, $x_2$, $x_1$, $x_0$, $y_3$, $y_2$, $y_1$, $y_0$, p, q and r and values of the coordinate indications and parity indications recognized by the electronic pen are denoted by $x_3'$, $x_2'$, $x_1'$, $x_0'$, $y_3'$, $y_2'$, $y_1'$, $y_0'$, p', q' and r'. Values E1, E2 and E3 calculated by mathematical Equation (7) using the values of the indications recognized by the electronic pen are listed in Table 1 below.

TABLE 1

| Error Pattern | E1 | E2 | E3 | Correction Operation |
|---|---|---|---|---|
| No Error | 0 | 0 | 0 | — |
| $x_0' \leftarrow (x_0 + A)$ | A | A | 0 | $x_0 \leftarrow (x_0' - A)$ |
| $x_1' \leftarrow (x_1 + A)$ | A | 2A | 0 | $X_1 \leftarrow (x_1' - A)$ |
| $x_2' \leftarrow (x_2 + A)$ | A | 4A | 0 | $X_2 \leftarrow (x_2' - A)$ |
| $x_3' \leftarrow (x_3 + A)$ | 0 | A | A | $X_3 \leftarrow (x_3' - A)$ |
| $y_0' \leftarrow (y_0 + A)$ | A | 0 | A | $y_0 \leftarrow (y_0' - A)$ |
| $y_1' \leftarrow (y_1 + A)$ | A | 0 | 2A | $y_1 \leftarrow (y_1' - A)$ |
| $y_2' \leftarrow (y_2 + A)$ | A | 0 | 4A | $y_2 \leftarrow (y_2' - A)$ |
| $y_3' \leftarrow (y_3 + A)$ | 0 | A | 2A | $y_3 \leftarrow (y_3' - A)$ |
| $p' \leftarrow (p + A)$ | -A | 0 | 0 | — |
| $q' \leftarrow (q + A)$ | 0 | -A | 0 | |
| $r' \leftarrow (r + A)$ | 0 | 0 | -A | |

If all of the indications are free of errors, it should be always that E1=E2=E3=0. However, if an error of +A occurs to the value of $x_0$, $x_0'$ is recognized as $(x_0+A)$ as illustrated in Table 1. When mathematical Equation (7) is calculated using $(x_0+A)$, E1=A, E2=A and E3=0. Therefore, it is concluded from the pattern (E1, E2, E3)=(A, A, 0) calculated by mathematical Equation (7) that $x_0'$ is an erroneous value. Thus $x_0'$ may be corrected to $x_0$ by $(x_0'-A)$. The values of E1, E2 and E3 may be calculated in the same manner in other cases. One thing to note herein is that the number of possible cases having one error is 11 and an indication having an error may be identified from an (E1, E2, E3) pattern since 11 different patterns are produced by calculating (E1 E2, E3) values in each of the 11 cases. It is also noted that the error can be corrected, Mathematical Equation (7) may be defined in various fashions and Table 1 may also be different accordingly.

In the exemplary embodiment using the parity generation method based on mathematical Equation (6), one or two errors may be detected or one error may be corrected.

However, it is impossible to detect three or more errors with the parity generation method based on mathematical Equation (6). For example, if an error of +A occurs to all of $x_3$, q and r, mathematical Equation (6) is satisfied. As a result, a position recognition error of $7^3 \times A$ (=343×A), is generated according to mathematical Equations (1) and (2). To avoid impossible error detection situations caused by errors of parity indications, the present invention provides the following <Parity generation rule 2>.

<Parity Generation Rule 2>

(1) Each coordinate indication is involved in generation of all parities during generation of the parities;

(2) When one or more errors are generated, one or more parities calculated by a parity generation formula using the values of coordinate indications having the errors are different from the existing parities; and (3) If as many errors as the total number of parities are generated in the coordinate indications and the parity indications, with one error in the coordinate indications and the other errors in the parity indications, the errors should be always detected.

To describe an exemplary embodiment satisfying Parity generation rule 2, it is assumed that parities are generated by mathematical Equation (8) in the exemplary embodiment of recognizing the position of the electronic pen according to FIGS. 2A, 2B, 3A, and 3B, and mathematical Equations (1) and (2).

$$p=(x_3+x_2+x_1+x_0+y_3+y_2+y_1+y_0) \bmod 7$$

$$q=(x_3+3x_2+2x_1+2x_0+6y_3+4y_2+5y_1+5y_0) \bmod 7$$

$$r=(x_3+2x_2+4x_1+3x_0+y_3+2y_2+4y_1+6y_0) \bmod 7 \quad \text{Equation (8)}$$

Referring to mathematical Equation (8), each of the coordinate indications $x_3$, $x_2$, $x_1$, $x_0$, $y_3$, $y_2$, $y_1$ and $y_0$ is involved in generation of all of the parity indications p, q and r. Besides, when mathematical Equation (8) is calculated regarding one or two errors, one or more of the parity generation equations are not satisfied in mathematical Equation (8). When three errors are generated, with one error in the coordinate indications and the other two errors in the parity indications, one or more of the parity generation equations are not satisfied all the time in mathematical Equation (8) and thus the errors are detected.

The above mathematical Equation (8) satisfies <Parity generation rule 2> and enables detection of more errors although increasing the computation complexity, compared to mathematical Equation (6). Further, the parity generation Equation (8) has the capability of correcting one error as well as detecting one or two errors. To describe the capability of the parity generation Equation (8), mathematical Equation (8) may be modified to mathematical Equation (9).

$$E4=(x_3+x_2+x_1+x_0+y_3+y_2+y_1+y_0-p) \bmod 7$$

$$E5=(x_3+3x_2+2x_1+2x_0+6y_3+4y_2+5y_1+5y_0-q) \bmod 7$$

$$E6=(x_3+2x_2+4x_1+3x_0+y_3+2y_2+4y_1+6y_0-r) \bmod 7 \quad \text{Equation (9)}$$

Values E4, E5 and E6 calculated by mathematical Equation (9) regarding error patterns are listed in Table 2 below.

TABLE 2

| Error Pattern | E4 | E5 | E6 | Correction Operation |
|---|---|---|---|---|
| No Error | 0 | 0 | 0 | — |
| $x_0' \leftarrow (x\_0 + A)$ | A | 2A | 3A | $x_0 \leftarrow (x_0' - A)$ |
| $x_1' \leftarrow (x\_1 + A)$ | A | 2A | 4A | $X_1 \leftarrow (x_1' - A)$ |
| $x_2' \leftarrow (x_2 + A)$ | A | 3A | 2A | $X_2 \leftarrow (x_2' - A)$ |
| $x_3' \leftarrow (x_3 + A)$ | A | A | A | $X_3 \leftarrow (x_3' - A)$ |
| $y_0' \leftarrow (y_0 + A)$ | A | 5A | 6A | $y_0 \leftarrow (y_0' - A)$ |
| $y_1' \leftarrow (y_1 + A)$ | A | 5A | 4A | $y_1 \leftarrow (y_1' - A)$ |
| $y_2' \leftarrow (y_2 + A)$ | A | 4A | 2A | $y_2 \leftarrow (y_2' - A)$ |
| $y_3' \leftarrow (y_3 + A)$ | A | 6A | A | $y_3 \leftarrow (y_3' - A)$ |
| $p' \leftarrow (p + A)$ | −A | 0 | 0 | — |
| $q' \leftarrow (q + A)$ | 0 | −A | 0 | |
| $r' \leftarrow (r + A)$ | 0 | 0 | −A | |

The number of possible cases having one error is 11. Since 11 different patterns are produced by calculating (E4, E5, E6) values in each case, an indication having an error may be identified from an (E4, E5, E6) pattern and the error may be corrected. Mathematical Equation (9) may be defined in various fashions and Table 2 may also be different accordingly.

In the exemplary embodiment using the parity generation method based on mathematical Equation (8), two or fewer errors may be detected or one or fewer error may be corrected.

Figure 7:
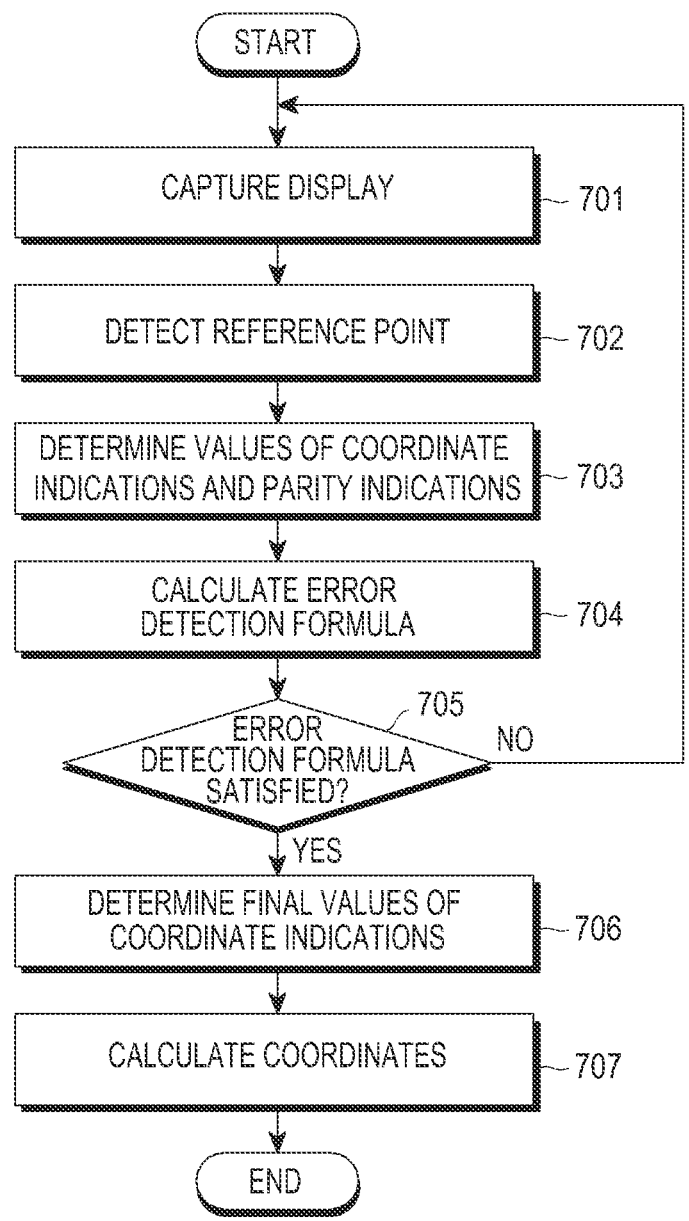
FIG. 7 is a flowchart illustrating a coordinates determination operation including error detection according to an exemplary embodiment of the present invention.

FIG. 7 is a flowchart illustrating a coordinates determination operation including error detection according to an exemplary embodiment of the present invention.

Referring to FIG. 7, a pixel image is captured on the surface of the display through the camera of the electronic pen in step 701. In step 702, a reference point is detected by processing the captured pixel image. The values of X-coordinate indications, Y-coordinate indications, and parity indications in a recognized area are recognized by comparing the patterns of the indications with predetermined patterns in step 703. In the exemplary embodiment illustrated in FIGS. 2A, 2B, 3A, and 3B, the X-coordinate indications and the Y-coordinate indications may be denoted by $x_3$, $x_2$, $x_1$, $x_0$, $y_3$, $y_2$, $y_1$ and $y_0$ and the parity indications may be denoted by p, q and r. As illustrated in FIG. 4, each of the coordinate indications $x_3$, $x_2$, $x_1$, $x_0$, $y_3$, $y_2$ and $y_1$ may range from 0 to 6 and the coordinate indication $y_0$ may range from 0 to 3. These values may be defined in a different manner depending on the type of a system. In step 704, an error detection formula is calculated using the recognized values of the X-coordinate indications and the Y-coordinate indications. While mathematical Equations (6) and (8) are used for error detection in exemplary embodiments of the present invention, other error detection formulas may be defined depending on a system situation.

If the error detection formula is fully satisfied, which means that no error has been generated in step 705, the recognized X-coordinate indications and Y-coordinate indications are determined to be correct in step 706 and the input position of the electronic pen is detected by calculating final coordinates using the X-coordinate indications and Y-coordinate indications in a predetermined rule in step 707. In the exemplary embodiment of the present invention, the input position of the electronic pen may be calculated by mathematical Equations (1) and (2). However, various coordinate calculation formulas are available depending on systems.

On the contrary, if the error detection formula is not satisfied and thus it is determined that an error has been generated in step 705, the procedure returns to step 701, without further proceeding to the subsequent coordinates determination operation.

A whole or part of the above-described operation, for example, the reference point detection, the recognition of the values of the X-coordinate indications and the Y-coordinate indications, the determination of whether an error has been generated using an error detection formula, and the determination of the input position of the electronic pen by calculating final coordinates may be performed in the electronic pen or in an external electronic device other than the electronic pen.

Figure 8:
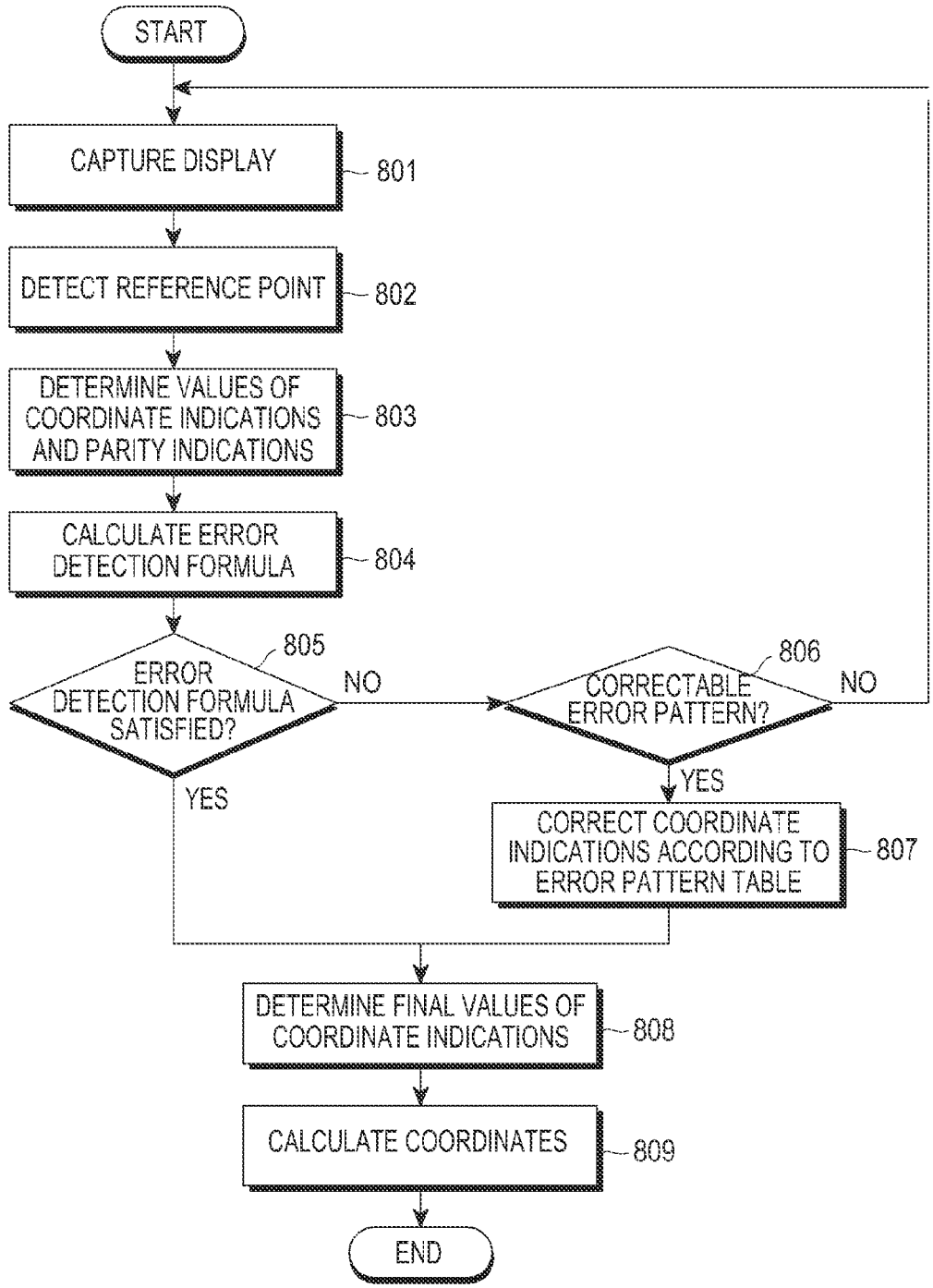
FIG. 8 is a flowchart illustrating a coordinates determination operation including error detection and error correction according to an exemplary embodiment of the present invention.

FIG. 8 is a flowchart illustrating a coordinates determination operation including error detection and error correction according to an exemplary embodiment of the present invention.

Referring to FIG. 8, a pixel image is captured on the surface of the display through the camera of the electronic pen in step 801. In step 802, a reference point is detected by processing the captured pixel image. The values of X-coordinate indications, Y-coordinate indications, and parity indications in a recognized area are recognized by comparing the patterns of the indications with predetermined patterns in step 803. In the exemplary embodiment illustrated in FIGS. 2A, 2B, 3A, and 3B, the X-coordinate indications and the Y-coordinate indications may be denoted by $x_3$, $x_2$, $x_1$, $x_0$, $y_3$, $y_2$, $y_1$ and $y_0$ and the parity indications may be denoted by p, q and r. As illustrated in FIG. 4, each of the coordinate indications $x_3$, $x_2$, $x_1$, $x_0$, $y_3$, $y_2$ and $y_1$ may range from 0 to 6 and the coordinate indication $y_0$ may range from 0 to 3. These values may be defined in a different manner depending on the type of a system.

In step 804, an error detection formula is calculated using the recognized values of the X-coordinate indications and the Y-coordinate indications. While mathematical Equations (6) and (8) are used for error detection in exemplary embodiments of the present invention, other error detection formulas may be defined depending on a system situation.

If the error detection formula is fully satisfied, which means that no error has been generated in step 805, the recognized X-coordinate indications and Y-coordinate indications are determined to be correct in step 808 and the input position of the electronic pen is detected by calculating final coordinates using the X-coordinate indications and Y-coordinate indications in a predetermined rule in step 809. In the exemplary embodiment of the present invention, the input position of the electronic pen may be calculated by mathematical Equations (1) and (2). However, various coordinate calculation formulas are available depending on systems.

On the contrary, if the error detection formula is not satisfied and thus it is determined that an error has been generated in step 805, it is determined whether to correct the error by comparing a generated error pattern with a predetermined error correction pattern table in step 806.

In the exemplary embodiment of the present invention, Table 1 or Table 2 may be used as the error correction pattern table. Depending on system requirements, various error correction pattern tables are available. If it is determined that error correction is available in step 806, the value of a coordinate indication having the error is corrected according to the rule of the error correction pattern table in step 807. Subsequently, the corrected X-coordinate indications and Y-coordinate indications are determined to be final X-coordinate indications and Y-coordinate indications in step 808 and the input position of the electronic pen is determined by calculating coordinates using the final X-coordinate indications and Y-coordinate indications according to the predetermined rule in step 809. If it is determined that error correction is unavailable in step 806, the procedure returns to step 801 without further proceeding to the subsequent coordinates determination operation.

A whole or part of the above-described operation, for example, the reference point detection, the recognition of the values of the X-coordinate indications and the Y-coordinate indications, the determination of whether an error has been generated using an error detection equation, the determination of error correction possibility, and the determination of the input position of the electronic pen by correcting the error and calculating final coordinates may be performed in the electronic pen or in an external electronic device other than the electronic pen.

Figure 9:
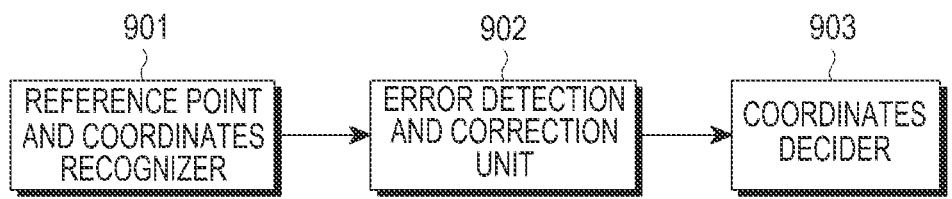
FIG. 9 is a block diagram of a coordinates determination apparatus that performs error detection and error correction according to an exemplary embodiment of the present invention.

FIG. 9 is a block diagram of a coordinates determination apparatus that performs error detection and error correction according to an exemplary embodiment of the present invention.

Referring to FIG. 9, a reference point and coordinates recognizer 901 detects a reference point by processing a pixel image captured from the surface of the display through the camera of the electronic pen and recognizes the values of X-coordinate indications, Y-coordinate indications, and parity indications in a recognized area by comparing the patterns of the indications with predetermined patterns.

An error detection and correction unit 902 calculates an error detection formula using the recognized X-coordinate indications and Y-coordinate indications. If the error detection formula is fully satisfied and thus it is determined that the recognized X-coordinate indications and Y-coordinate indications have no errors, the error detection and correction unit 902 determines the recognized X-coordinate indications and Y-coordinate indications as correct and provides the X-coordinate indications and Y-coordinate indications to a coordinates decider 903. On the contrary, if the error detection formula is not fully satisfied and thus it is determined that the recognized X-coordinate indications and NT-coordinate indications have an error, the error detection and correction unit 902 determines whether error correction is available, referring to a predetermined error correction pattern table, if error correction is available, the error detection and correction unit 902 corrects the coordinate indications according to the rule of the error correction pattern table and determines the corrected X-coordinate indications and Y-coordinate indications as final coordinate indications and provides the final X-coordinate indications and Y-coordinate indications to the coordinates decider 903.

The coordinates decider 903 finally determines the input position of the electronic pen by calculating coordinates according to a predetermined rule using the X-coordinate indications and Y-coordinate indications received from the error detection and correction unit 902.

All or a part of the function units illustrated in FIG. 9 may be provided in the electronic pen or in an external electronic device other than the electronic pen.

As is apparent from the above description of the present invention, when an error is generated during recognizing a position and a pattern using an electronic pen in a touch input-based display device, the error can be efficiently detected or corrected. Therefore, the position and pattern can be recognized more accurately.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method of detecting coordinates of a position of an electronic pen on a display based on a plurality of pixel groups arranged on the display, the method comprising:
   capturing an image of a pixel group corresponding to a specific position through a camera provided in the electronic pen, when the electronic pen points to the specific position on the display;
   detecting a reference point in the pixel group by processing the captured image of the pixel group and determining values of a plurality of coordinate indications and a plurality of parity indications corresponding to the position of the pixel group;
   determining whether an error has been detected in the determined values of the plurality of coordinate indications by applying a predetermined error detection formula to the determined values of the plurality of coordinate indications and the plurality of parity indications; and
   determining final coordinates of the electronic pen by applying a predetermined coordinates calculation rule to the determined values of the plurality of coordinate indications, when no error has been detected in the determined values of the plurality of coordinate indications,
   wherein the error detection formula is based on a parity generation formula that generates the plurality of parity indications, the parity generation formula includes at least one parity indication calculation equation which includes a X-coordinate indication and a Y-coordinate indication.

2. The method of claim 1,
   wherein the plurality of coordinate indications and the plurality of parity indications have predetermined patterns defined as predetermined values, and
   wherein the determination of the values of the plurality of coordinate indications and the plurality of parity indications comprises determining the predetermined values corresponding to the predetermined patterns of the plurality of coordinate indications and the plurality of parity indications as the values of the plurality of coordinate indications and the plurality of parity indications.

3. The method of claim 2, wherein the determination of whether an error has been detected comprises determining that an error has been detected, when the determined values of the plurality of coordinate indications and the plurality of parity indications do not satisfy the error detection formula.

4. The method of claim 2, wherein the parity generation formula includes a plurality of parity indication calculation equations corresponding to the plurality of parity indications, and each of the parity indication calculation equations includes at least two of the plurality of coordinate indications.

5. The method of claim 4, wherein, when an error is generated in at least one coordinate indication, at least one of values of the plurality of parity indications calculated by the parity generation formula is different from the determined value of a parity indication.

6. The method of claim 5, wherein the coordinates calculation rule is defined as the following equations, $$X=7^3 \times x_3+7^2 \times x_2+7 \times x_1+x_0$$

$$Y=7^3 \times 4 \times y_3+7 \times 4 \times y_2+4 \times y_1+y_0$$

and the parity indication calculation equations included in the parity generation formula are the following equations, $$p=(x_0+x_1+x_2+y_0+y_1+y_2) \bmod 7$$

$$q=(x_0+2x_1+4x_2+x_3+y_2) \bmod 7$$

$$r=(y_0+2y_1+4y_2+x_3+2y_3) \bmod 7.$$

7. The method of claim 5,
wherein each of the parity indication calculation equations included in the parity generation formula includes all of the plurality of coordinate indications, and
wherein, when as many errors as the number of the plurality of parity indications are generated and one of the errors is generated in one of the plurality of the coordinate indications, at least one of the values of the plurality of parity indications calculated by the parity generation formula is different from the determined value of a parity indication.

8. The method of claim 7, wherein the coordinates calculation rule is defined as the following equations, $$X=7^3 \times x_3+7^2 \times x_2+7 \times x_1+x_0$$

$$Y=7^3 \times 4 \times y_3+7 \times 4 \times y_2+4 \times y_1+y_0$$

and the parity indication calculation equations included in the parity generation formula are the following equations, $$p=(x_3+x_2+x_1+x_0+y_3+y_2+y_1+y_0) \bmod 7$$

$$q=(x_3+3x_2+2x_1+2x_0+6y_3+4y_2+5y_1+5y_0) \bmod 7$$

$$r=(x_3+2x_2+4x_1+3x_0+y_3+2y_2+4y_1+6y_0) \bmod 7.$$

9. The method of claim 1, wherein, when an error has been detected in the determined values of the plurality of coordinate indications and the plurality of parity indications, further comprising:
determining whether the detected error is correctable; and
correcting the determined values of the plurality of coordinate indications according to a predetermined error correction rule, when the detected error is correctable, and determining the final coordinates of the electronic pen by applying the predetermined coordinates calculation rule to the corrected values of the plurality of coordinate indications.

10. A method of detecting coordinates of a position of an electronic pen on a display based on a plurality of pixel groups arranged on the display, the method comprising:
receiving from the electronic pen an image of a pixel group corresponding to a specific position captured through a camera provided in the electronic pen, when the electronic pen points to the specific position on the display and detecting a reference point in the pixel group by processing the captured image of the pixel group;
determining values of a plurality of coordinate indications and a plurality of parity indications corresponding to the position of the pixel group;
determining whether an error has been detected in the determined values of the plurality of coordinate indications by applying a predetermined error detection formula to the determined values of the plurality of coordinate indications and the plurality of parity indications; and
determining final coordinates of the electronic pen by applying a predetermined coordinates calculation rule to the determined values of the plurality of coordinate indications, when no error has been detected in the determined values of the coordinate indications,
wherein the error detection formula is based on a parity generation formula that generates the plurality of parity indications, the parity generation formula includes at least one parity indication calculation equation which includes a X-coordinate indication and a Y-coordinate indication.

11. The method of claim 10,
wherein the plurality of coordinate indications and the plurality of parity indications have predetermined patterns defined as predetermined values, and
wherein the determination of the values of the plurality of coordinate indications and the plurality of parity indications comprises determining the predetermined values corresponding to the predetermined patterns of the plurality of coordinate indications and the plurality of parity indications as the values of the plurality of coordinate indications and the plurality of parity indications.

12. The method of claim 11, wherein the determination of whether an error has been detected comprises determining that an error has been detected, when the determined values of the plurality of coordinate indications and the plurality of parity indications do not satisfy the error detection formula.

13. The method of claim 11, wherein the parity generation formula includes a plurality of parity indication calculation equations corresponding to the plurality of parity indications, and each of the parity indication calculation equations includes at least two of the plurality of coordinate indications.

14. The method of claim 13, wherein, when an error is generated in at least one coordinate indication, at least one of values of the plurality of parity indications calculated by the parity generation formula is different from the determined value of a parity indication.

15. The method of claim 14, wherein the coordinates calculation rule is defined as the following equations, $$X=7^3 \times x_3+7^2 \times x_2+7 \times x_1+x_0$$

$$Y=7^3 \times 4 \times y_3+7 \times 4 \times y_2+4 \times y_1+y_0$$

and the parity indication calculation equations included in the parity generation formula are the following equations, $$p=(x_0+x_1+x_2+y_0+y_1+y_2) \bmod 7$$

$$q=(x_0+2x_1+4x_2+x_3+y_2) \bmod 7$$

$$r=(y_0+2y_1+4y_2+x_3+2y_3) \bmod 7.$$

16. The method of claim 14,
wherein each of the parity indication calculation equations included in the parity generation formula includes all of the plurality of coordinate indications, and
wherein, when as many errors as the number of the plurality of parity indications are generated and one of the errors is generated in one of plurality of the coordinate indications, at least one of the values of the plurality of parity indications calculated by the parity generation formula is different from the determined value of a parity indication.

17. The method of claim 16, wherein the coordinates calculation rule is defined as the following equations, $$X = 7^3 \times x_3 + 7^2 \times x_2 + 7 \times x_1 + x_0$$

$$Y = 7^3 \times 4 \times y_3 + 7 \times 4 \times y_2 + 4 \times y_1 + y_0$$

and the parity indication calculation equations included in the parity generation formula are the following equations, $$p = (x_3 + x_2 + x_1 + x_0 + y_3 + y_2 + y_1 + y_0) \bmod 7$$

$$q = (x_3 + 3x_2 + 2x_1 + 2x_0 + 6y_3 + 4y_2 + 5y_1 + 5y_0) \bmod 7$$

$$r = (x_3 + 2x_2 + 4x_1 + 3x_0 + y_3 + 2y_2 + 4y_1 + 6y_0) \bmod 7.$$

18. The method of claim 10, wherein, when an error has been detected in the determined values of the plurality of coordinate indications and the plurality of parity indications, further comprising:
determining whether the detected error is correctable; and
correcting the determined values of the plurality of coordinate according to a predetermined error correction rule, when the detected error is correctable, and determining the final coordinates of the electronic pen by applying the predetermined coordinates calculation rule to the corrected values of the plurality of coordinate indications.

19. An apparatus to detect coordinates of a position on a display based on a plurality of pixel groups arranged on the display, the apparatus comprising:
a camera unit configured to capture an image of a pixel group corresponding to a specific position, when an electronic pen points to the specific position on the display;
a recognizer configured to:
detect a reference point in the pixel group by processing the captured image of the pixel group, and
determine values of a plurality of coordinate indications and a plurality of parity indications corresponding to the position of the pixel group;
an error detection and correction unit configured to:
determine whether an error has been detected in the determined values of the plurality of coordinate indications by applying a predetermined error detection formula to the determined values of the plurality of coordinate indications and the plurality of parity indications, and
output the determined values of the plurality of coordinate indications, when no error has been detected in the determined values of the plurality of coordinate indications; and
a coordinates decider configured to determine final coordinates of the electronic pen by applying a predetermined coordinates calculation rule to the values of the output plurality of coordinate indications and the plurality of parity indications,
wherein the error detection formula is based on a parity generation formula that generates the plurality of parity indications, the parity generation formula includes at least one parity indication calculation equation which includes a X-coordinate indication and a Y-coordinate indication.

20. The apparatus of claim 19,
wherein the plurality of coordinate indications and the plurality of parity indications have predetermined patterns defined as predetermined values, and
wherein the recognizer determines the predetermined values corresponding to the predetermined patterns of the plurality of coordinate indications and the plurality of parity indications as the values of the plurality of coordinate indications and the plurality of parity indications.

21. The apparatus of claim 20, wherein the error detection and correction unit determines that an error has been detected, when the determined values of the plurality of coordinate indications and the plurality of parity indications do not satisfy the error detection formula.

22. The apparatus of claim 19, wherein the parity generation formula includes a plurality of parity indication calculation equations corresponding to the plurality of parity indications, and each of the parity indication calculation equations includes at least two of the plurality of coordinate indications.

23. The apparatus of claim 22, wherein, when an error is generated in at least one coordinate indication, at least one of values of the plurality of parity indications calculated by the parity generation formula is different from the determined value of a parity indication.

24. The apparatus of claim 23, wherein the coordinates calculation rule is defined as the following equations, $$X = 7^3 \times x_3 + 7^2 \times x_2 + 7 \times x_1 + x_0$$

$$Y = 7^3 \times 4 \times y_3 + 7 \times 4 \times y_2 + 4 \times y_1 + y_0$$

and the parity indication calculation equations included in the parity generation formula are the following equations, $$p = (x_0 + x_1 + x_2 + y_0 + y_1 + y_2) \bmod 7$$

$$q = (x_0 + 2x_1 + 4x_2 + x_3 + y_2) \bmod 7$$

$$r = (y_0 + 2y_1 + 4y_2 + x_3 + 2y_3) \bmod 7.$$

25. The apparatus of claim 23,
wherein each of the parity indication calculation equations included in the parity generation formula includes all of the plurality of coordinate indications, and
wherein, when as many errors as the number of the plurality of parity indications are generated and one of the errors is generated in one of the plurality of the coordinate indications, at least one of the values of the plurality of parity indications calculated by the parity generation formula is different from the determined value of a parity indication.

26. The apparatus of claim 25, wherein the coordinates calculation rule is defined as the following equations, $$X = 7^3 \times x_3 + 7^2 \times x_2 + 7 \times x_1 + x_0$$

$$Y = 7^3 \times 4 \times y_3 + 7 \times 4 \times y_2 + 4 \times y_1 + y_0$$

and the parity indication calculation equations included in the parity generation formula are the following equations, $$p=(x_3+x_2+x_1+x_0+y_3+y_2+y_1+y_0) \bmod 7$$

$$q=(x_3+3x_2+2x_1+2x_0+6y_3+4y_2+5y_1+5y_0) \bmod 7$$

$$r=(x_3+2x_2+4x_1+3x_0+y_3+2y_2+4y_1+6y_0) \bmod 7.$$

27. The apparatus of claim 19, wherein, when an error has been detected in the determined values of the plurality of coordinate indications and the plurality of parity indications, the error detection and correction unit determines whether the detected error is correctable, corrects the determined values of the plurality of coordinate indications according to a predetermined error correction rule, when the detected error is correctable, and outputs the corrected values of the plurality of coordinate indications.

28. The apparatus of claim 19, wherein the apparatus is included in the electronic pen.

29. An apparatus to detect coordinates of a position on a display based on a plurality of pixel groups arranged on the display, the apparatus comprising:
a recognizer configured to:
    detect a reference point in an image of a pixel group corresponding to a specific position by processing the image of the pixel group, the image of pixel group being captured by a camera provided in an electronic pen, when the electronic pen points to the specific position on the display, and
    determine values of a plurality of coordinate indications and a plurality of parity indications corresponding to the position of the pixel group;
an error detection and correction unit configured to:
    determine whether an error has been detected in the determined values of the plurality of coordinate indications by applying a predetermined error detection formula to the determined values of the plurality of coordinate indications and the plurality of parity indications, and
    output the determined values of the plurality of coordinate indications, when no error has been detected in the determined values of the plurality of coordinate indications and the plurality of parity indications; and
a coordinates decider configured to determine final coordinates of the electronic pen by applying a predetermined coordinates calculation rule to the output values of the plurality of coordinate indications,
wherein the error detection formula is based on a parity generation formula that generates the plurality of parity indications, the parity generation formula includes at least one parity indication calculation equation which includes a X-coordinate indication and a Y-coordinate indication.

30. The apparatus of claim 29,
wherein the plurality of coordinate indications and the plurality of parity indications have predetermined patterns defined as predetermined values, and
wherein the recognizer determines the predetermined values corresponding to the predetermined patterns of the plurality of coordinate indications and the plurality of parity indications as the values of the plurality of coordinate indications and the plurality of parity indications.

31. The apparatus of claim 30, wherein, when the determined values of the plurality of coordinate indications and the plurality of parity indications do not satisfy the error detection formula, the error detection and correction unit determines that an error has been detected.

32. The apparatus of claim 30, wherein the parity generation formula includes a plurality of parity indication calculation equations corresponding to the plurality of parity indications, and each of the parity indication calculation equations includes at least two of the plurality of coordinate indications.

33. The apparatus of claim 32, wherein, when an error is generated in at least one coordinate indication, at least one of values of the plurality of parity indications calculated by the parity generation formula is different from the determined value of a parity indication.

34. The apparatus of claim 33, wherein the coordinates calculation rule is defined as the following equations, $$X=7^3 \times x_3 + 7^2 \times x_2 + 7 \times x_1 + x_0$$

$$Y=7^3 \times 4 \times y_3 + 7 \times 4 \times y_2 + 4 \times y_1 + y_0$$

and the parity indication calculation equations included in the parity generation formula are the following equations, $$p=(x_0+x_1+x_2+y_0+y_1+y_2) \bmod 7$$

$$q=(x_0+2x_1+4x_2+x_3+y_2) \bmod 7$$

$$r=(y_0+2y_1+4y_2+x_3+2y_3) \bmod 7.$$

35. The apparatus of claim 33,
wherein each of the parity indication calculation equations included in the parity generation formula includes all of the plurality of coordinate indications, and
wherein, when as many errors as the number of the plurality of parity indications are generated and one of the errors is generated in one of the plurality of the coordinate indications, at least one of the values of the plurality of parity indications calculated by the parity generation formula is different from the determined value of a parity indication.

36. The apparatus of claim 35, wherein the coordinates calculation rule is defined as the following equations, $$X=7^3 \times x_3 + 7^2 \times x_2 + 7 \times x_1 + x_0$$

$$Y=7^3 \times 4 \times y_3 + 7 \times 4 \times y_2 + 4 \times y_1 + y_0$$

and the parity indication calculation equations included in the parity generation formula are the following equations, $$p=(x_3+x_2+x_1+x_0+y_3+y_2+y_1+y_0) \bmod 7$$

$$q=(x_3+3x_2+2x_1+2x_0+6y_3+4y_2+5y_1+5y_0) \bmod 7$$

$$r=(x_3+2x_2+4x_1+3x_0+y_3+2y_2+4y_1+6y_0) \bmod 7.$$

37. The apparatus of claim 29, wherein, when an error has been detected in the determined values of the plurality of coordinate indications and the plurality of parity indications, the error detection and correction unit determines whether the detected error is correctable, corrects the determined values of the plurality of coordinate indications according to a predetermined error correction rule, when the detected error is correctable, and outputs the corrected values of the plurality of coordinate indications.

* * * * *